(12) United States Patent
Kim

(10) Patent No.: US 7,498,859 B2
(45) Date of Patent: Mar. 3, 2009

(54) DRIVING DEVICE USING CMOS INVERTER

(75) Inventor: Keun Kook Kim, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 10/878,313

(22) Filed: Jun. 29, 2004

(65) Prior Publication Data

US 2005/0140413 A1    Jun. 30, 2005

(30) Foreign Application Priority Data

Dec. 26, 2003    (KR) .................... 10-2003-0097426

(51) Int. Cl.
    *H03H 11/26*    (2006.01)
(52) U.S. Cl. ................... 327/262; 327/378; 327/285
(58) Field of Classification Search ................ 327/378, 327/261–262, 285, 288, 277–278, 538, 540–541; 323/313

See application file for complete search history.

(56) References Cited

U.S. PATENT DOCUMENTS

| 5,012,141 | A | * | 4/1991 | Tomisawa | 327/276 |
|---|---|---|---|---|---|
| 5,039,893 | A | * | 8/1991 | Tomisawa | 327/276 |
| 5,369,354 | A | * | 11/1994 | Mori | 323/313 |
| 5,544,120 | A | * | 8/1996 | Kuwagata et al. | 365/222 |
| 5,905,677 | A | * | 5/1999 | Casagrande et al. | 365/185.23 |
| 6,163,195 | A | * | 12/2000 | Jefferson | 327/262 |
| 6,292,028 | B1 | * | 9/2001 | Tomita | 326/86 |
| 6,323,721 | B1 | * | 11/2001 | Proebsting | 327/535 |
| 6,373,341 | B1 | * | 4/2002 | Morgan | 331/57 |
| 2003/0222692 | A1 | * | 12/2003 | Morikawa | 327/261 |

FOREIGN PATENT DOCUMENTS

KR    1020010048992 A    6/2001

\* cited by examiner

*Primary Examiner*—Long Nguyen
*Assistant Examiner*—Ryan C Jager
(74) *Attorney, Agent, or Firm*—Townsend and Townsend and Crew LLP

(57) ABSTRACT

A driving device using a CMOS inverter performs a stable operation by using a compensating circuit to compensate variation widths when the process condition or external environment is changed. The driving device comprises a power regulating unit for regulating a driving voltage level depending on characteristics of a MOS transistor and a delay unit comprising a plurality of CMOS inverters driven by the driving voltage regulated by the power regulating unit.

10 Claims, 6 Drawing Sheets

DRIVING DEVICE USING CMOS INVERTER

BACKGROUND OF THE INVENTION

1. Field of the Invention

The present invention generally relates to a driving device using a CMOS inverter, and more specifically, to a driving device using a CMOS inverter which can perform a stable operation due to a compensating circuit for compensating variations caused by changes of process conditions or external environments are changed.

2. Description of the Prior Art

FIG. 1 is a circuit diagram of a delay circuit using a conventional CMOS inverter.

The delay circuit of FIG. 1 comprises inverters IV1~IV4 connected serially. An input signal IN is sequentially inverted by inverters, and outputted as an output signal OUT. Here, the number of inverters determines a phase of the output signal OUT. That is, when the odd number of inverters is used, the phase of the output signal OUT opposite to that of the input signal IN is delayed. When the even number of inverters is used, the phase of the output signal OUT identical with that of the input signal IN is delayed.

The basic operation of the inverter is performed by inter-compensation effect of a NMOS transistor and a PMOS transistor that form an inverter. If one of process factors or external environment in the two transistors is changed, their characteristics are affected.

As a result, although only using digital signals can perform the normal operation, the above variation may interrupt the normal operation when the timing is regulated or the oscillation having a predetermined cycle is required.

FIG. 2 is a circuit of an oscillator using a conventional CMOS inverter.

The oscillator of FIG. 2 comprises inverters IV5~IV9 connected serially. An output terminal of the inverter IV9 is connected to an input terminal of the inverter IV5.

FIGS. 3A to 3C are timing diagrams illustrating the operation when the process condition and the environment condition of the oscillator are simultaneously changed.

FIG. 3A is a timing diagram illustrating the normal mode at 25° C. FIG. 3B is a timing diagram illustrating the fast mode at −5° C. Here, in the fast mode, the NMOS transistor and the PMOS transistor are manufactured at the process condition where they operate fast. FIG. 3C is a timing diagram illustrating the slow mode at 85° C. Here, in the slow mode, the NMOS transistor and the PMOS transistor are manufactured at the process condition where they operate slowly.

As described above, when the oscillator is embodied only with an inverter, the delay time is changed depending on the process condition.

In order to reduce the variation, a passive device that has relatively low process variations is connected between inverters.

FIG. 4 is a circuit diagram illustrating another example of the delay circuit using a conventional CMOS inverter.

The delay circuit of FIG. 4 comprises inverters IV11~IV14 and resistors R1~R3 which are alternately connected in serial. NMOS type capacitors NC1, NC2 and NC3 are connected to output terminals of the inverters IV11, IV12 and IV13 and PMOS type capacitors PC1, PC2 and PC3 are connected to input terminals of the inverters IV12, IV13 and IV14, respectively.

In the above-described example, the resistors R1~R3 and the capacitors NC1.about.NC3 and PC1.about.PC3 are used to reduce the change of inverter characteristics resulting from change of the CMOS transistor comprised in an inverter.

However, the area of the chip increases because the resistor uses an active surface or a gate layer and the capacitor uses a gate capacitor.

Furthermore, although the characteristics of the passive device is not changed by the process condition or external environment, it is impossible to compensate the current variation because current which determines the operating characteristics flows through the CMOS transistor comprised in an inverter.

SUMMARY OF THE INVENTION

It is an object of the present invention to compensate driving capacity resulting from change of the process condition and external environment.

It is another object of the present invention to compensate phase transition resulting from characteristic change by using a compensating circuit that utilizes characteristics of a transistor.

It is still another object of the present invention to stably secure a timing margin of a CMOS inverter against change in characteristics of a transistor by the process condition or external environment.

In an embodiment, a driving device using a CMOS inverter comprises a power regulating unit for regulating a driving voltage depending on characteristics of a MOS transistor; and a delay unit comprising a plurality of CMOS inverters driven by the driving voltage regulated by the power regulating unit.

In another embodiment, a driving device using a CMOS inverter comprises a power regulating unit for regulating a driving voltage level depending on characteristics of a MOS transistor; and an oscillating unit comprising a plurality of CMOS inverters driven by the driving voltage regulated by the power regulating unit, wherein an output terminal of the oscillating unit is connected to an input terminal.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
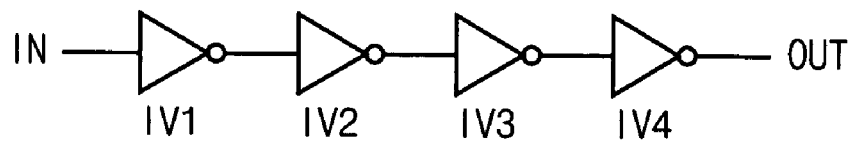
FIG. 1 is a circuit diagram of a delay circuit using a conventional CMOS inverter.
Figure 2:
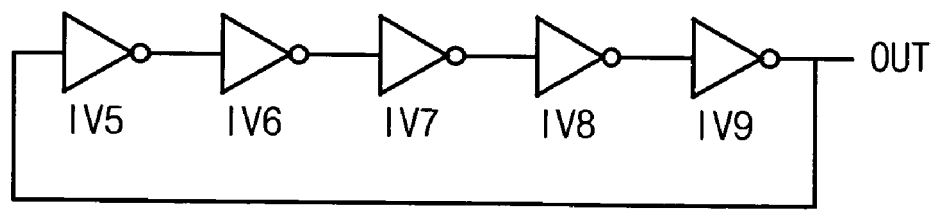
FIG. 2 is a circuit of an oscillator using a conventional CMOS inverter.
Figure 3A:
FIGS. 3A-3C are timing diagrams illustrating the operation when the process condition and the environment condition of the oscillator are simultaneously changed.
Figure 3B:
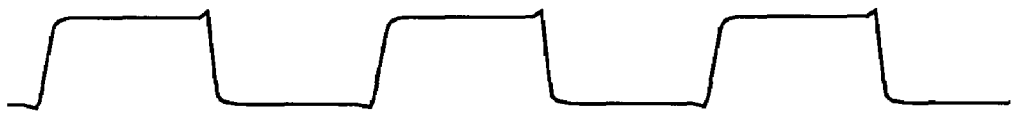
Figure 3C:
Figure 4:
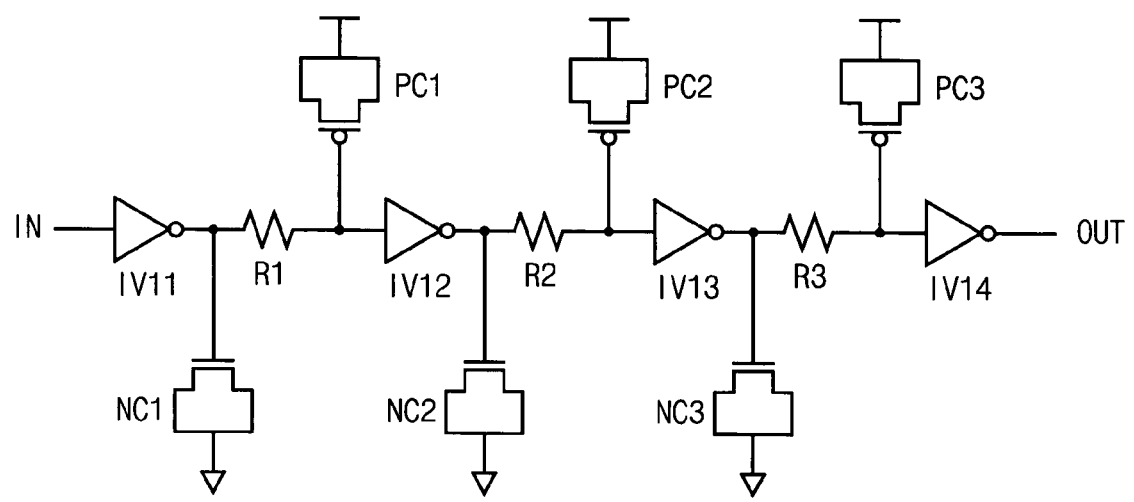
FIG. 4 is a circuit diagram illustrating another example of the delay circuit using a conventional CMOS inverter.
Figure 5:
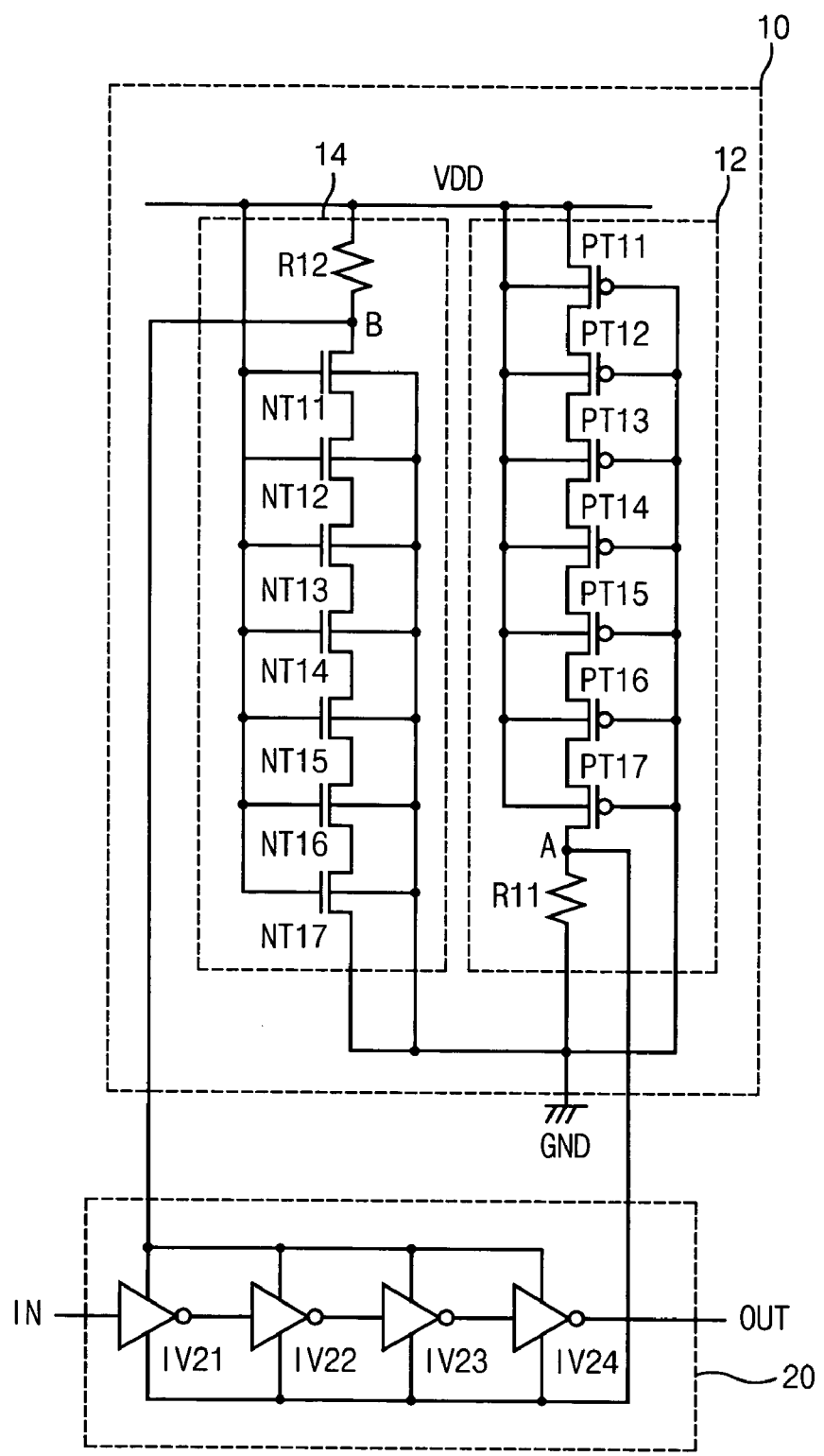
FIG. 5 is a circuit diagram of a delay circuit using a CMOS inverter according to an embodiment of the present invention.

FIG. 5 is a circuit diagram of a delay circuit using a CMOS inverter according to an embodiment of the present invention.

In an embodiment, the delay circuit comprises a power control unit 10 and a delay unit 20.

The power control unit 10 comprises a low driving voltage generating unit 12 and a high driving voltage generating unit 14. The low driving voltage generating unit 12 comprises PMOS transistors PT11~PT17 and a resistor R11 which are connected serially between a power voltage terminal VDD and a ground terminal GND. Each of the PMOS transistors PT11~PT17 has a gate connected to the ground terminal GND, and a substrate connected to the power voltage terminal VDD. A low driving voltage A is outputted from the common node of the PMOS transistor PT17 and the resistor R11. The high driving voltage generating unit 14 comprises a resistor R12 and NMOS transistors NT11~NT17 which are connected serially between the power voltage terminal VDD and the ground terminal GND. Each of the NMOS transistors NT11~NT17 has a gate connected to the power voltage VDD, and a substrate connected to the ground terminal GND. A high driving voltage B is outputted from the common node of the resistor R12 and the NMOS transistor NT11.

The delay unit 20 comprises inverters IV21~IV24 connected serially. Each of the inverters IV21~IV24, which is driven by the high driving voltage B and the low driving voltage A. As a result, the delay circuit delays an input signal IN and outputs an output signal OUT.

The above-described power control unit 10, which serves as a variable compensating circuit, regulates delay time of the inverters IV21~IV24 of the delay unit 20 by varying the driving voltages A and B.

Figure 6:
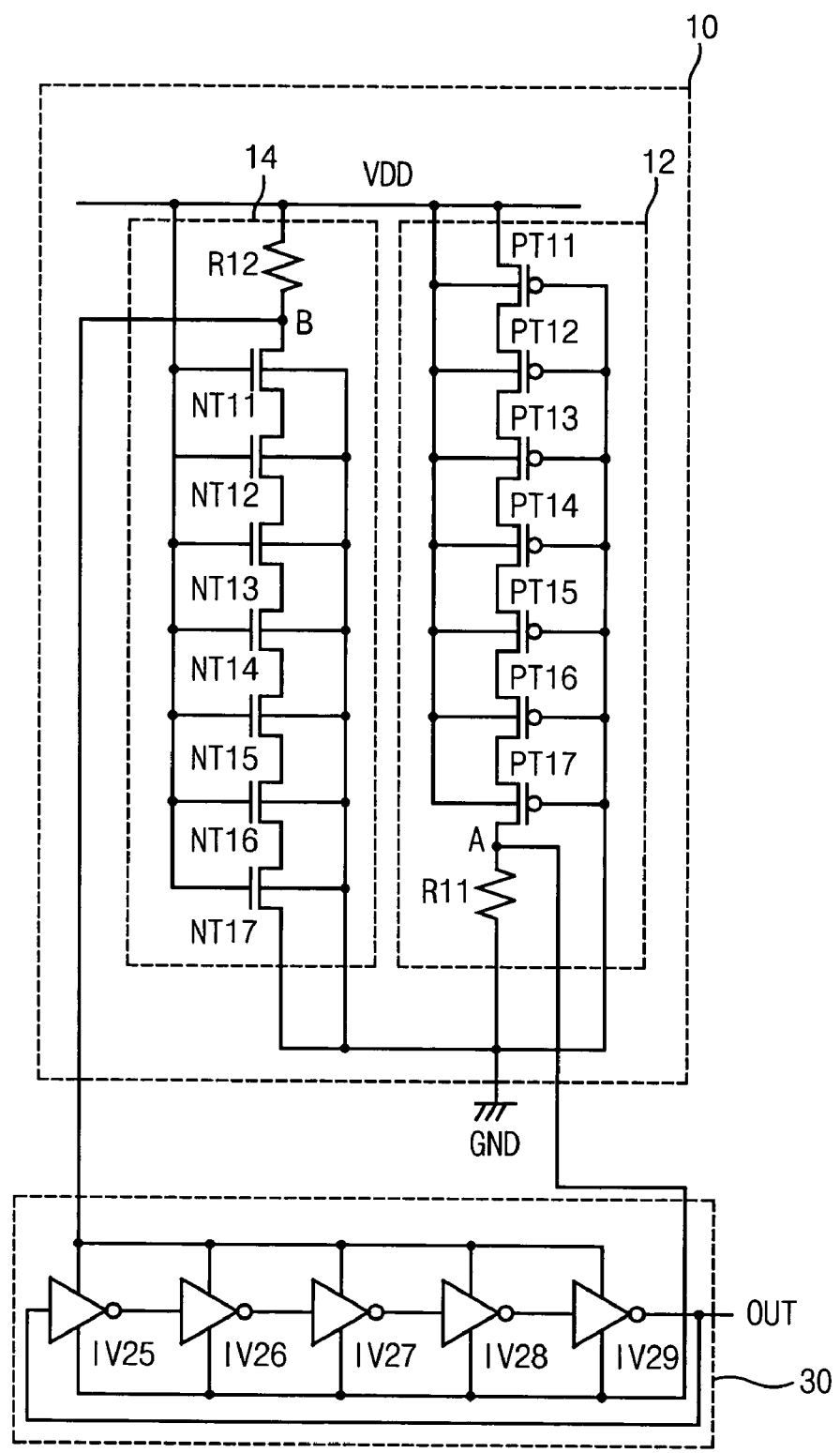
FIG. 6 is a circuit diagram illustrating another example of an oscillator using a CMOS inverter.

FIG. 6 is a circuit diagram illustrating another example of an oscillator using a CMOS inverter.

In an embodiment, the oscillator comprises a power control unit 10 and an oscillating unit 30.

The power control unit 10 comprises a low driving voltage generating unit 12 and a high driving voltage generating unit 14. The low driving voltage generating unit 12 comprises PMOS transistors PT11~PT17 and a resistor R11 which are connected serially between a power voltage terminal VDD and a ground terminal GND. Each of the PMOS transistors PT11~PT17 has a gate connected to the ground terminal GND, and a substrate connected to the power voltage terminal VDD. A low driving voltage A is outputted from the common node of the PMOS transistor PT17 and the resistor R11. The high driving voltage generating unit 14 comprises a resistor R12 and NMOS transistors NT11~NT17 which are connected serially between the power voltage terminal VDD and the ground terminal GND. Each of the NMOS transistors NT11~NT17 has a gate connected to the power voltage VDD, and a substrate connected to the ground terminal GND. A high driving voltage B is outputted from the common node of the resistor R12 and the NMOS transistor NT11.

The oscillating unit 30 comprises inverters IV25~IV29 connected serially. An output terminal of the inverter IV29 is connected to an input terminal of the inverter IV25. Each of the inverters IV25~IV29 is driven by the high driving voltage B and the low driving voltage A, and outputs an oscillating signal OUT.

Accordingly, the delay time or the oscillating period can be regulated by a method for controlling an inverter driving voltage using characteristic change of the MOS transistors.

When the PMOS transistor is configured to perform a fast operation so that a threshold voltage VT becomes low, resistance of the PMOS transistor becomes lower. As a result, the low driving voltage A becomes higher. On the other hand, when the PMOS transistor is configured to perform a slow operation so that a threshold voltage VT becomes high, resistance of the PMOS transistor becomes higher. As a result, the low driving voltage A becomes lower.

Meanwhile, when the NMOS transistor is configured to perform a fast operation so that a threshold voltage VT becomes low, resistance of the NMOS transistor becomes higher. As a result, the high driving voltage B becomes lower. On the other hand, when the NMOS transistor is configured to perform a slow operation so that a threshold voltage VT becomes high, resistance of the NMOS transistor becomes lower. As a result, the high driving voltage B becomes higher.

If the driving voltages A and B are combined, the driving voltage of the inverter is varied depending on change of the transistor. The driving power B-A become lower if the NMOS transistor or the PMOS transistor performs the fast operation, and become higher if the NMOS transistor or the PMOS transistor performs the slow operation.

If the temperature becomes higher, the resistance of the PMOS transistor becomes higher so that the low driving voltage A becomes lower, and the resistance of the NMOS transistor becomes lower so that the high driving voltage B becomes higher.

Figure 7A:
FIGS. 7A-7C are timing diagrams illustrating the operation of FIG. 6 when the process condition and the environment condition of the oscillator are simultaneously changed.
Figure 7B:
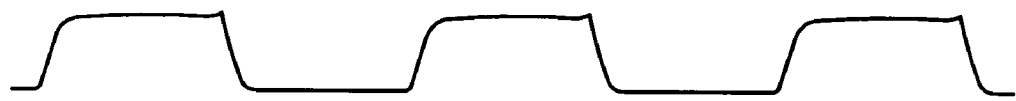
Figure 7C:

FIGS. 7A to 7C are timing diagrams illustrating the operation when the process condition and the environment condition of the oscillator are simultaneously changed.

FIG. 7A is a timing diagram illustrating the normal mode at 25° C. FIG. 7B is a timing diagram illustrating the fast mode at −5° C. Here, in the fast mode, the NMOS transistor and the PMOS transistor are manufactured at the process condition where they operate fast. FIG. 7C is a timing diagram illustrating the slow mode at 85° C. Here, in the slow mode, the NMOS transistor and the PMOS transistor are manufactured at the process condition where they operate slowly.

Generally, transition time which is one of the basic characteristics of the inverter becomes shorter as the high driving voltage B becomes higher and longer as the high driving voltage B becomes lower. As a result, the high driving voltage B becomes lower to increase delay time when the transistor is configured to perform the fast operation, and the driving voltage B becomes higher to decrease delay time when the transistor is configured to perform the slow operation. Additionally, the high driving voltage B becomes higher when the temperature is high, and becomes lower when the temperature is low.

The size and the number of NMOS transistors and PMOS transistors in the power control unit 10 serving as a compensating circuit are regulated to be suitable for the basic characteristics of the transistor.

Also, the resistor is a passive device to affect the change in characteristics of the transistor.

Accordingly, the CMOS inverter according to an embodiment of the present invention can be applied in order to stably secure a timing margin of enable circuits (i.e., sense amplifier, bit line equalization circuit) of specific circuits or an oscillator whose timing condition is important.

As discussed earlier, a driving device using a CMOS inverter according to an embodiment of the present invention can compensate driving capacity resulting from change of the process condition and external environment or phase variable time resulting from characteristic change by using a compensating circuit which employs characteristics of a transistor.

In addition, a timing margin of the CMOS inverter to the characteristic change of the transistor by the process condition or external environment can be stably secured.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A driving device, comprising:
   a delay unit comprising a plurality of CMOS inverters driven by a low driving voltage and a high driving voltage;
   a low power regulating unit for outputting the low driving voltage, wherein the low power regulating circuit comprises a plurality of PMOS transistors coupled in series between a power source and a first output node, the gates of the PMOS transistors being directly connected to ground, the low power regulating circuit further comprising a first resistor coupled between the first output node and the ground; and
   a high power regulating unit for outputting the high driving voltage, the high power regulating unit comprising a plurality of NMOS transistors coupled in series between the ground and a second output node, the gates of the NMOS transistors being directly connected to the power source, the high power regulating unit further comprising a second resistor coupled between the second output node and the power source.

2. The driving device according to claim 1, wherein the first resistor is a passive device.

3. The driving device according to claim 1, wherein each substrate of the plurality of PMOS transistors is connected to the power source.

4. The driving device according to claim 1, wherein the second resistor is a passive device.

5. The driving device according to claim 1, wherein each substrate of the plurality of NMOS transistors is connected to the ground.

6. A driving device, comprising:
   an oscillating unit comprising a plurality of CMOS inverters driven by a low driving voltage and a high driving voltage, wherein an output terminal of the oscillating unit is connected to an input terminal of the oscillating unit;
   a low power regulating unit for outputting the low driving voltage, wherein the low power regulating circuit comprises a plurality of PMOS transistors coupled in series between a power source and a first output node, the gates of the PMOS transistors being directly connected to ground, the low power regulating circuit further comprising a first resistor coupled between the first output node and the ground; and
   a high power regulating unit for outputting the high driving voltage, the high power regulating unit comprising a plurality of NMOS transistors coupled in series between the ground and a second output node, the gates of the NMOS transistors being directly connected to the power source, the high power regulating unit further comprising a second resistor coupled between the second output node and the power source.

7. The driving device according to claim 6, wherein the first resistor is a passive device.

8. The driving device according to claim 6, wherein each substrate of the plurality of PMOS transistors is connected to the power source.

9. The driving device according to claim 6, wherein the second resistor is a passive device.

10. The driving device according to claim 6, wherein each substrate of the plurality of NMOS transistors is connected to the ground.

* * * * *